United States Patent [19]
Kai et al.

[11] Patent Number: 5,610,406
[45] Date of Patent: Mar. 11, 1997

[54] CHARGED PARTICLE BEAM EXPOSURE METHOD AND APPARATUS

[75] Inventors: Junichi Kai, Kawasaki; Mitsuhiro Nakano, Kasugai, both of Japan

[73] Assignee: Fujitsu Limited, Kawasaki, Japan

[21] Appl. No.: 410,294

[22] Filed: Mar. 24, 1995

[30] Foreign Application Priority Data

Mar. 30, 1994 [JP] Japan ................... 6-061531

[51] Int. Cl.$^6$ ...................... H01J 37/04
[52] U.S. Cl. ................ 250/492.22; 250/400
[58] Field of Search .............. 250/492.22, 400, 250/398

[56] References Cited

U.S. PATENT DOCUMENTS

| | | | |
|---|---|---|---|
| 4,410,800 | 10/1983 | Yoshikawa | 250/492.22 |
| 4,891,524 | 1/1990 | Yasuda et al. | 250/398 |
| 5,180,920 | 1/1993 | Kai et al. | 250/492.22 |
| 5,194,741 | 3/1993 | Sakamoto et al. | 250/492.22 |
| 5,334,846 | 8/1994 | Nakano et al. | 250/400 |

FOREIGN PATENT DOCUMENTS

5-90142  4/1993  Japan .

*Primary Examiner*—Bruce C. Anderson
*Attorney, Agent, or Firm*—Armstrong, Westerman, Hattori, McLeland & Naughton

[57] ABSTRACT

A charged particle beam exposure method which irradiates a charged particle beam on a substrate placed on a stage while continuously moving the stage and deflecting the charged particle beam by main deflector means and sub deflector means. The charged particle beam exposure method includes the steps of calculating stage moving information which describes an optimum expected locus of a stage moving speed with respect to a frame region based on a stage moving speed that enables exposure within each cell region within the frame region, by defining the frame region as being made up of a plurality of cell regions arranged in a moving direction of the stage within a drawable range in which the charged particle beam can be deflected by the main deflector means, and controlling a deflected position of the charged particle beam caused by the main deflector means by variably controlling the stage moving speed based on said stage moving information.

16 Claims, 8 Drawing Sheets

| |
|---|
| STARTING POINT COORDINATE |
| END POINT COORDINATE |
| INITIAL SPEED |
| NO. OF CHIPS |
| CHIP ARRANGING PITCH |
| CHIP START POSITION |
| NO. OF SPEED CHANGES (n) |
| SPEED CHANGING PITCH (p) |
| SPEED 1 |
| SPEED 2 |
| SPEED 3 |
| ⁀ |
| SPEED n-2 |
| SPEED n-1 |
| SPEED n |

FIG. 3A

CALCULATE DECELERATING POINTS
BY DSP    $L=(V1-V2)/\alpha$

FIG. 3B

DECELERATE FROM SPEED
CHANGING POINT

CHARGED PARTICLE BEAM EXPOSURE METHOD AND APPARATUS

BACKGROUND OF THE INVENTION

1. Field of the Invention

The present invention generally relates to charged particle beam exposure methods and apparatuses, and more particularly to a charged particle beam exposure method which carries out the exposure with respect to a substrate placed on a stage while continuously moving the stage, and to a charged particle beam exposure apparatus which employs such a charged particle beam exposure method.

2. Description of the Related Art

Recently, the integration density of integrated circuits (ICs) has further improved, and the integration density of ICs have improved to approximately four times over the past several years. For example, in dynamic random access memories (DRAMs), the storage capacity is being improved from 1M to 4M, 16M, 64M, 256M and even 1 G by the improvement in the integration density. The improvement in the integration density was realized mainly by the progress made in the technique used for forming fine patterns. In other words, due to the progress made in the photolithography technique, it has become possible to expose fine patterns on the order of 0.5 µm.

However, when the photolithography technique is used, the limit of the fine pattern that can be exposed is approximately 0.4 µm. In addition, when forming windows for contact holes and making an alignment with respect to an underlying layer, it is extremely difficult to guarantee an accuracy of 0.15 µm or less using the photolithography technique.

On the other hand, much attention is drawn to exposure techniques using a charged particle beam typified by an electron beam. It is expected that the charged particle beam exposure technique can realize the exposure of finer patterns and the highly accurate alignment at a high speed with a high reliability when compared to the photolithography technique.

In the case of the electron beam exposure, when the exposing patterns include dense and coarse portions, the exposure time becomes long at the dense portion and short at the coarse portion. In other words, the exposure speed becomes high or low depending on whether the exposing pattern is coarse or dense. For this reason, when a substrate to be exposed is placed on a stage and the stage is continuously moved, it is necessary to set the moving speed of the stage depending on the exposing patterns. That is, the stage moving speed is set low for the dense portion of the exposing pattern, and high for the coarse portion of the exposing pattern. As a result, the exposure time cannot be reduced sufficiently in the conventional charged particle beam exposure method which moves the stage continuously.

In order to solve the above described problem, an improved charged particle beam exposure method was previously proposed in a Japanese Laid-Open Patent Application No. 5-90142.

According to this previously proposed method, a large deflection range of an exposure region is divided into a plurality of band-shaped regions each extending in a direction perpendicular to the moving direction of the stage, and the exposure time is calculated for each band-shaped region. The large deflection range refers to a range in which the charged particle beam can be deflected within the large deflection range by a large deflector. In addition, a plurality of band-shaped regions arranged along the stage moving direction is defined as a cell region, and the moving speed of the stage that enables the exposure in the cell region is calculated. Furthermore, in order to enable movement of the stage in the cell region at the stage moving speed which makes it possible to carry out the exposure within the exposure time, a frame region is defined as being made up of a plurality of cell regions arranged along the stage moving direction, and 16 speed changing points and speeds are set for this frame region. The exposure is carried out while changing the stage moving speed depending on the set speed changing points and speeds.

Therefore, when actually carrying out the exposure, the exposure time is calculated for each band-shaped region, and the exposure speed is determined based on the calculated exposure time. For this reason, the exposure time, that is, the stage moving speed, is variably set depending on the coarse and dense portions of the exposing patterns, thereby reducing unnecessary movements of the stage at the low speed.

A description related to the actual operations that are carried out when determining the stage moving speed in the previously proposed method will be omitted in this specification.

When the stage starts to move at the stage moving speed which is determined in the above described manner, a stage controller samples the amount of deflection of the large deflector (hereinafter simply referred to as a large deflection quantity) for every 1 ms, so as to continue monitoring the drawing state, that is, whether the stage moving speed is too fast, too slow or appropriate with respect to the specified drawing range. If the large deflection quantity exceeds the drawable region, the stage controller recognizes the stage moving direction, and judges whether the stage movement should be accelerated or decelerated. Hence, the patterns are drawn while variably controlling the stage moving speed.

However, when drawing within the frame region, not only the drawable state but three other states may occur. The three other states will hereinafter referred to as a beam OFF state, a non-reached state, and a passed state.

In the beam OFF state, the exposure beam is OFF. In this beam OFF state, the large deflection quantity at the time when the beam is OFF is held when making the stage control. For this reason, it is possible to control the stage to accelerate, decelerate or move at a constant speed depending on the setting of the value of the large deflection quantity that is held. Normally, when carrying out the exposure by continuously moving the stage, the exposure beam is turned OFF only at the start and end positions of the frame region. Accordingly, in the beam OFF state, the large deflection quantity is set within the drawable range so that the stage moves at the constant speed.

In the non-reached state, the exposure beam has not reached the drawable range. Unless in the drawable state, the large deflection quantity in the drawable state where the exposure beam is OFF at the previous stage remains held in the non-reached state. For this reason, the stage control in the non-reached state is carried out similarly as in the beam OFF state.

In the passed state, the exposure beam has passed the drawable range. In this passed state, a target value for drawing the next cell region is updated, and the drawing is started again. The large deflection quantity in the passed state corresponds to the drawable range in the stage moving direction, and the stage is decelerated by the stage control.

Therefore, in the previously proposed method, a host computer conjectures in advance the large deflection quantity while monitoring the drawing state, and variably controls the stage moving speed based on this conjecture.

But according to the previously proposed method, the number of changing points where the stage moving speed can be changed within the frame region is limited to a constant number regardless of the number of cell regions. More particularly, the number of changing points is only 16. For this reason, when the number of chips within the frame region increases, there was a problem in that the previously proposed method cannot cope with fine changes in the stage moving speed. In other words, after the stage moving speed is changed by a fixed number of times (16 times) within the frame region, the stage moving speed for the remaining parts of the frame region had to be set to the fixed slow speed that conforms to the most dense pattern.

In addition, when controlling the stage to accelerate or decelerate in the drawing state, the host computer had to control the large deflection quantity for each of the states which may occur during the drawing of the patterns and are other than the drawable state, that is, for each of the beam OFF state, the non-reached state and the passed state. As a result, there was also a problem in that the processing time associated with the control of the stage moving speed increases.

Furthermore, it is necessary to judge the drawing state in the stage controller based on the large deflection quantity. For this reason, there was a problem in that the processing time associated with the control of the stage moving speed also increases due to this judging process.

Because of the increased processing time, the load on the host computer and the stage controller is large when the previously proposed method is employed. Therefore, it was impossible to finely and accurately control the stage movement.

SUMMARY OF THE INVENTION

Accordingly, it is a general object of the present invention to provide a novel and useful charged particle beam exposure method and apparatus in which the problems described above are eliminated.

Another and more specific object of the present invention is to provide a charged particle beam exposure method which carries out an exposure by irradiating a charged particle beam on a substrate placed on a stage while continuously moving the stage and deflecting the charged particle beam by main deflector means and sub deflector means, comprising the steps of (a) calculating stage moving information which describes an optimum expected locus of a stage moving speed with respect to a frame region based on a stage moving speed that enables exposure within each cell region within the frame region, by defining the frame region as being made up of a plurality of cell regions arranged in a moving direction of the stage within a drawable range in which the charged particle beam can be deflected by the main deflector means, and (b) controlling a deflected position of the charged particle beam caused by the main deflector means by variably controlling the stage moving speed based on said stage moving information. According to the charged particle beam exposure method of the present invention, it is possible to reduce the load on the host computer and the stage controller, and to enable fine and accurate control of the stage movement, because it is possible to variably control the stage based on the stage moving information which describes the optimum expected locus of the stage moving speed.

Still another object of the present invention is to provide a charged particle beam exposure apparatus which carries out an exposure by irradiating a charged particle beam on a substrate placed on a stage while continuously moving the stage and deflecting the charged particle beam by main deflector means and sub deflector means, comprising first means for calculating stage moving information which describes an optimum expected locus of a stage moving speed with respect to a frame region based on a stage moving speed that enables exposure within each cell region within the frame region, by defining the frame region as being made up of a plurality of cell regions arranged in a moving direction of the stage within a drawable range in which the charged particle beam can be deflected by the main deflector means, and second means for controlling a deflected position of the charged particle beam caused by the main deflector means by variably controlling the stage moving speed based on said stage moving information. According to the charged particle beam exposure apparatus of the present invention, it is possible to reduce the load on the host computer and the stage controller, and to enable fine and accurate control of the stage movement, because it is possible to variably control the stage based on the stage moving information which describes the optimum expected locus of the stage moving speed.

Other objects and further features of the present invention will be apparent from the following detailed description when read in conjunction with the accompanying drawings.

DESCRIPTION OF THE PREFERRED EMBODIMENTS

Figure 1:
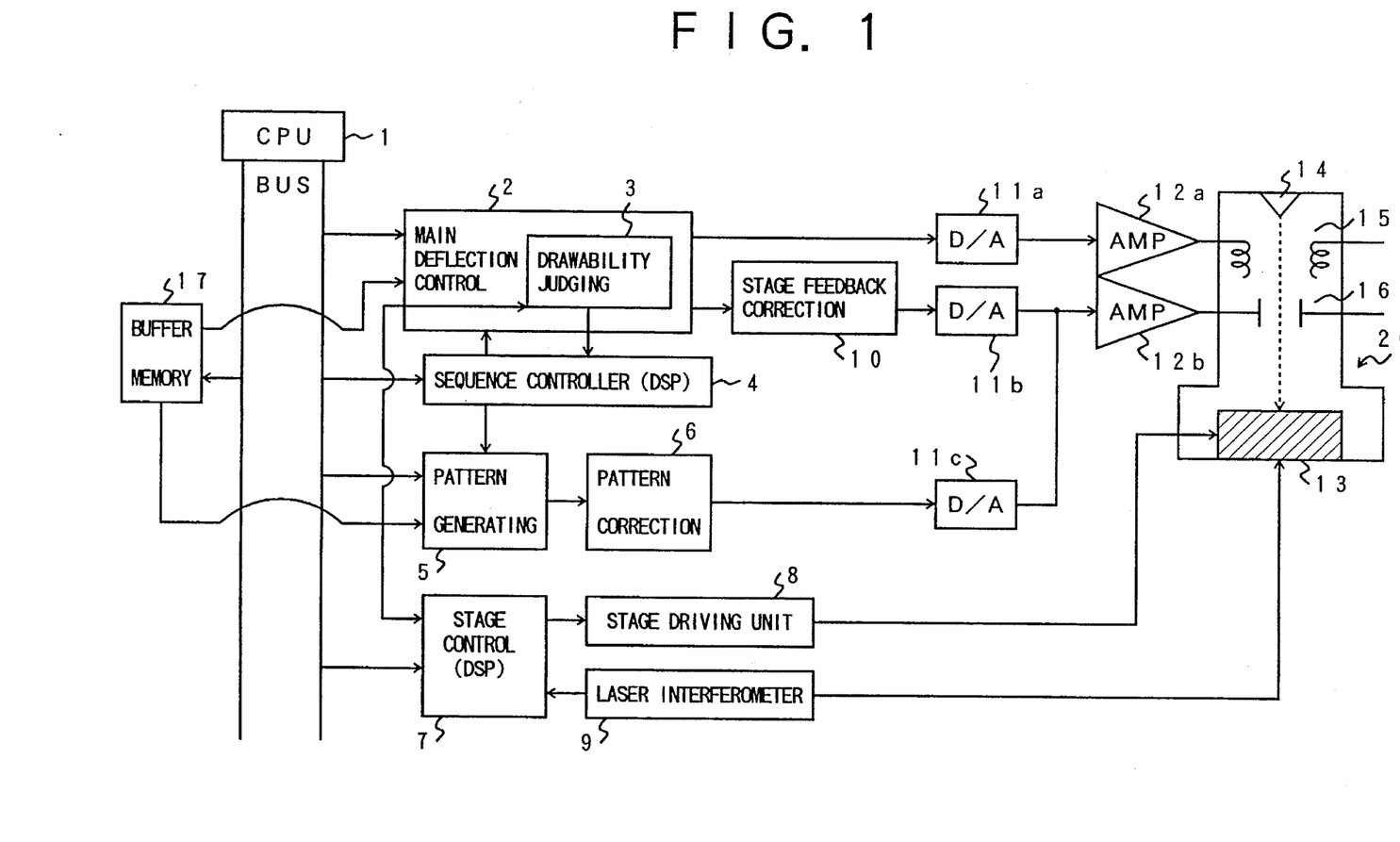
FIG. 1 is a system block diagram showing an embodiment of a charged particle beam exposure apparatus according to the present invention.

FIG. 1 shows the general construction of an embodiment of a charged particle beam exposure apparatus according to the present invention. In this embodiment, the present invention is applied to an electron beam exposure apparatus which employs an embodiment of a charged particle beam exposure method according to the present invention.

In FIG. 1, the electron beam exposure apparatus includes a central processing unit (CPU) 1, a main deflector control circuit 2, a digital signal processor (DSP) 4, a pattern generating circuit 5, a pattern correction circuit 6, a stage control circuit 7, a stage driving unit 8, a laser interferometer 9, a stage feedback correction circuit 10, digital-to-analog (D/A) converters 11a, 11b and 11c, amplifiers 12a and 12b, a buffer memory 17, and a column 20.

A drawability judging circuit 3 within the main deflector control circuit 2 judges whether or not the deflected position of the electron beam is in the drawable range based on the deflection quantity. The DSP 4 controls the exposure sequence. For example, the stage control circuit 7 is made up of a DSP.

On the other hand, the column 20 generally includes a stage 13, an electron gun 14, main deflector coils 15, and sub deflector coils 16. A substrate (not shown) such as a wafer which is to be exposed is placed on the stage 13. The stage driving unit 8 moves the stage 13 in directions X and Y based on an output signal of the stage control circuit 7. The position coordinate of the stage 13 is measured by the laser interferometer 9 and notified to the stage control circuit 7.

Known constructions may be used for the part of the drawability judging circuit 3 excluding the main deflector control circuit 2, the pattern generating circuit 5, the pattern correction circuit 6, the stage control circuit 7, the stage driving unit 8, the stage feedback correction circuit 10 and the like, and illustration and description related to the constructions of these elements will be omitted in this specification. For example, these elements may have the constructions proposed in the Japanese Laid-Open Patent Application No. 5-90142 referred above, and the operations of these elements themselves are known therefrom.

Pattern data related to the exposing pattern are stored in the buffer memory 17, and are supplied to the pattern correction circuit 6 via the pattern generating circuit 5. The pattern data obtained from the pattern correction circuit 6 are supplied to the sub deflector coils 16 via the D/A converter 11c and the amplifier 12b.

An electron beam is emitted from the electron gun 14, and a known slit deflector (not shown) forms this electron beam into an arbitrary shot having a square shape with a side of 3 μm or less, for example. This shot of the electron beam is then deflected by the main deflector coils 15 and the sub deflector coils 16. The main deflector coils 15 deflect the electron beam within the large deflection range of 10 mm or less, for example, while the sub deflector coils 16 deflect the electron beam within a small deflection range of approximately 100 μm, for example.

When carrying out the exposure while continuously moving the stage 13, the small deflection ranges (hereinafter referred to as sub fields) are gathered into a band-shaped region having a longitudinal direction which matches the direction X that is perpendicular to the stage moving direction Y. This band-shaped region will be called a band. Such bands are gathered in the large deflection range (hereinafter referred to as a main field) into a region which will be called a cell. A region made up of a predetermined number of such cells will be called a frame. The main field does not necessarily match the drawable range which will be described later. In other words, the main field indicates the range in which the electron beam can be deflected by the main deflector coils 15. On the other hand, the drawable range indicates a range which is within the main field and in which the actual drawing can be made with respect to the substrate.

In this embodiment, the buffer memory 17 is made up of a main memory part, a sub memory part, a band memory part and the like. The buffer memory 17 also includes memory regions for storing data related to a starting point (X1, Y1) indicating starting point where the pattern starts within the sub field, the size (X2, Y2) indicating the size of the pattern, and the pattern (or shape). The band memory part includes memory regions for storing the number of sub fields of each band, the number of patterns, the number of shots and the like.

The pattern generating circuit 5 includes shot decomposing means, counter means and the like. In other words, the pattern generating circuit 5 decomposes the size of a desired exposing pattern into shots, and obtains the number of shots required to expose the desired pattern. The CPU 1 calculates and determines the minimal stage moving speed that is required to expose the desired pattern by referring to the number of shots and the number of sub fields. In addition, the CPU 1 similarly calculates and determines the minimal stage moving speed that is required to expose each cell region based on the stage moving speed which is determined for each band. When carrying out the actual exposure, the stage moving speeds are specified to be less than or equal to the minimal stage moving speed that is required to expose each cell region and to a maximum continuous speed connecting each of the stage moving speeds.

Figure 2:
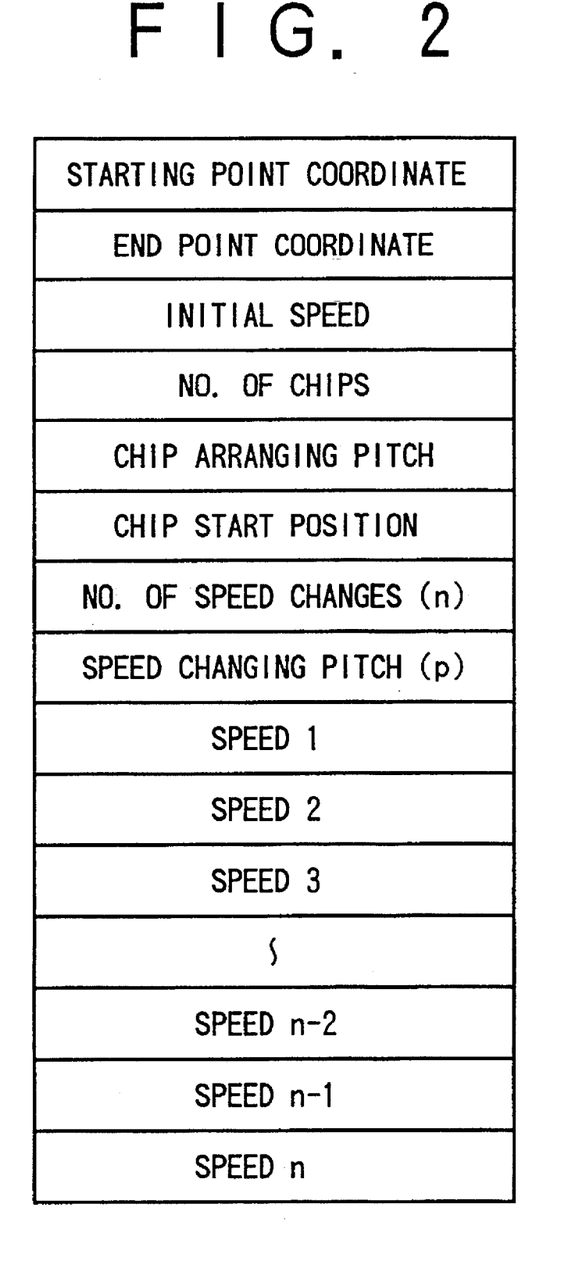
FIG. 2 is a diagram showing stage movement information.

The stage moving speeds within each of the cell regions that are determined by the above described process are gathered in a file format as retrievable data, and are stored in the buffer memory 17 as stage moving information. The stage moving information stored in the buffer memory 17 also includes information related to the stage moving speeds with respect to columns of bands for continuously exposing a plurality of cell regions. Accordingly, the stage moving information stored in the buffer memory 17 includes in addition to the speeds 1 through n with respect to each of the cell regions, information related to the starting point coordinate, the end point coordinate, the initial speed, the number of chips, the chip arranging pitch, the chip start position, the number of speed changes (n), the speed changing pitch (p) and the like as shown in FIG. 2. Such information included in the stage moving information is stored in each of the memory parts and the memory regions of the buffer memory 17. In other words, the stage moving information related to the movement of the stage 13 within the frame region for continuously exposing a plurality of cell regions describes an optimum expected locus of the stage moving speed such as that shown in FIG. 4 which will be described later, and is stored in the buffer memory 17 in advance as a kind of table. The stage moving information described above are read from the buffer memory 17 by the CPU 1 and is supplied to the stage control circuit 7.

In order to read the stage moving information at a high speed, it is possible to provide within the stage control circuit 7 a memory which is accessible at a higher speed than the buffer memory 17. In this case, the stage moving information is once read into this memory from the buffer memory 17 before starting the operation of the stage control circuit 7.

The calculation of the stage moving information is made based on band region exposure information. The band region exposure information includes for each band region information related to the number of patterns, the number of shots, the shot time, the number of sub fields within the band region and the like. However, accurate stage moving information cannot be obtained solely from the band region exposure region. As will be described later, the stage moving information must be calculated not only from the information related to each band but also from information dependent on the electron beam exposure apparatus. The information dependent on the electron beam exposure apparatus includes exposure density information indicating the exposure density when exposure data of each of the band regions are arranged in the entire exposure region, the current density of the electron beam, the settling times of the deflections made by the main deflector coils 15 and the sub deflector coils 16, the processing time required to decompose the patterns and the like.

The shot time when actually carrying out the exposure is dependent on the current density of the electron beam at that point in time. For example, if the sensitivity of the resist on the substrate is 50 $\mu C/cm^2$, the exposure time is 1 $\mu s$ when carrying out the exposure with a current density of 50 $A/cm^2$, but the exposure time is 5 $\mu s$ when carrying out the exposure with a current density of 10 $A/cm^2$.

In addition, when decomposing the pattern into shots, the processing time of this decomposition greatly depends on the beam size. For example, when decomposing a square pattern with a side of 10 $\mu m$ into shots having a maximum beam size of 3 $\mu m$ or less, the pattern can be exposed in 16 shots if the beam size is 2.5 $\mu m$, but 100 shots are required to expose the same pattern if the beam size is 1 $\mu m$.

Furthermore, when exposing 1 shot, there exist settling times such as the settling times of the deflections made by the main deflector coils 15 and the sub deflector coils 16. Such settling times differ depending on each of the individual electron beam exposure apparatuses.

Accordingly, it is desirable that the exposure time is set by taking into consideration all of the factors described above.

Hence, in this embodiment, the current density of the electron beam is measured when making the exposure on the electron beam exposure apparatus, and the exposure time of each shot is set by referring to the measured current density and the exposure quantity given by the pattern data. The total number of shots is multiplied to the exposure time of each shot. In general, not all patterns have the same exposure quantity within one data, but the differences in the exposure quantities for the patterns are very small and negligible when viewed in terms of the entire exposure time. Next, the settling time of the deflection made by the sub deflector coils 16 is multiplied to the total number of shots. In this state, if the settling time deviates depending on the distance between the shot positions, a representative value for the settling time is multiplied to the total number of shots. The settling time of the deflection made by the main deflector coils 15 is affected by the change from one band to another, and thus, this settling time may simply be added to the value which is obtained by multiplying the settling time of the deflection made by the sub deflector coils 16 to the total number of shots. As a result, it is possible to calculate approximately the optimum exposure time, and it is hence possible to calculate the optimum stage moving speed based on this optimum exposure time.

On the other hand, the stage moving speed may also be obtained by actually carrying out the exposure operation as a test. In this case, the exposure does not need to be made on the actual substrate. Hence, a time setting means for setting the stage moving time is provided, and the electron beam exposure apparatus is operated to measure the time it takes to actually move the stage 13. In this case, the stage 13 is moved at a stage moving speed that enables sufficient exposure. Then, the time it takes to expose each band is measured.

Next, a description will be given of the method of moving the stage 13. As described above, the stage 13 starts to move when the CPU 1 reads the stage moving information shown in FIG. 2 from the buffer memory 17 and supplies the stage moving information to the stage control circuit 7. First, the stage moving speed is accelerated, so that the stage moving speed reaches an initial speed specified by the stage moving information. Then, during the time when the deflected position of the electron beam caused by the main deflector coils 15 moves within the speed changing pitch p, the stage 13 is decelerated or accelerated so as to reach the next speed. However, when the speed is to be changed before the stage 13 reaches the specified speed in a state where the deflected position of the electron beam caused by the main deflector coils 15 is located other than at a boundary part of the speed changing pitch p, the stage 13 is not accelerated but moved as it is at the constant speed.

Figure 3A:
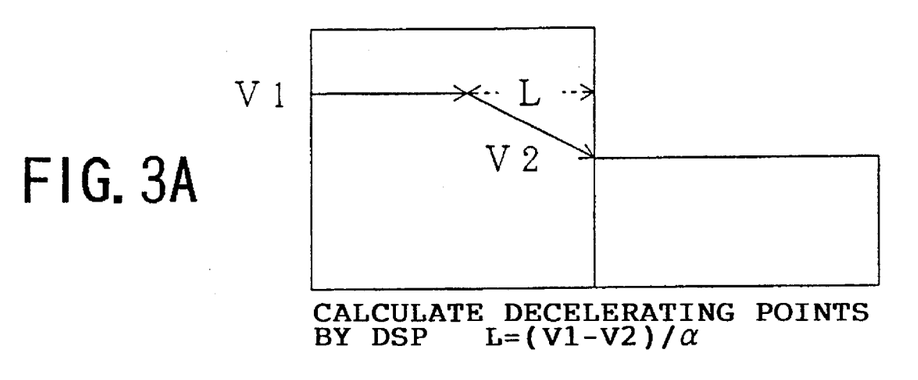
FIGS. 3A and 3B respectively are diagrams for explaining a speed changing point.

The speed changing point during the deceleration is obtained within the stage control circuit 7 by obtaining a speed difference between the next speed and the present speed and dividing this speed difference by the acceleration. As shown in FIG. 3A, the deceleration is started at a point that is L before the next speed changing point (moving point of the speed changing pitch p), and the control is carried out so that the actual stage moving speed will always not exceed the speed at the speed changing point. In this case, the speed at the point that is L before the next speed changing point can be obtained by $L=(V_n-V_{n+1})/\alpha$, where $V_n$ denotes the present speed, $V_{n+1}$ denotes the next speed and $\alpha$ denotes the acceleration.

Figure 3B:
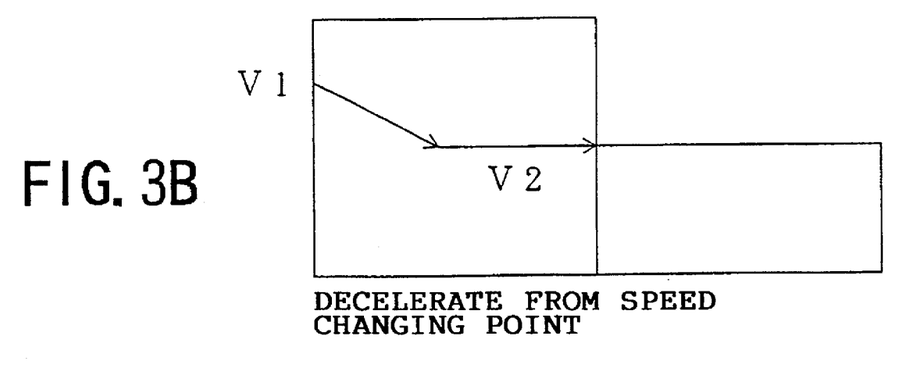

Accordingly, compared to the method which immediately decelerates the stage 13 from the speed changing point where the speed becomes the present speed $V_n$ until the next speed changing point is reached as shown in FIG. 3B, the method which decelerates the stage 13 as shown in FIG. 3A can more effectively reduce the exposure time.

Figure 4:
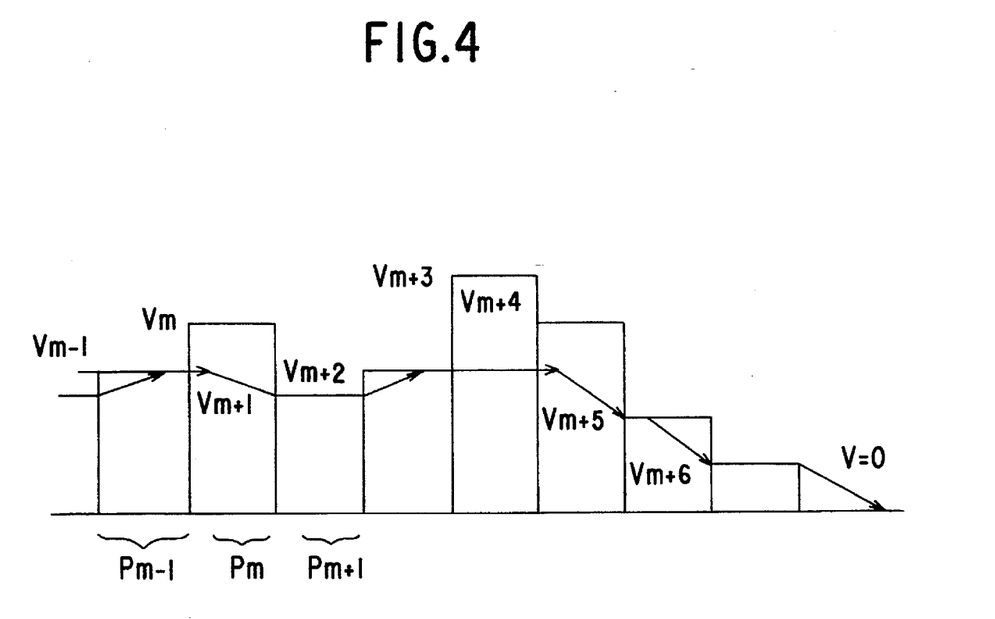
FIG. 4 is a diagram for explaining the control of the stage moving speed.

In the case shown in FIG. 4, the stage 13 is accelerated so as to reach the speed $V_{m-1}$ at the starting coordinate, and since the speed $V_{m-1}$ is reached within the moving time of the pitch $P_{m-1}$, the constant speed $V_{m-1}$ is maintained. The next target speed of the stage 13 is $V_m$, but since the (decelerating) speed changing point is reached before the speed becomes $V_m$, the constant speed $V_m$ is maintained and the deceleration starts from the (decelerating) speed changing point. As a result, the stage 13 reaches the speed $V_{m+1}$ within the moving time of the pitch $P_m$. Such an operation is repeated as shown in FIG. 4 when moving the stage 13.

In this embodiment, each pitch of the speed changing points corresponds to each cell region because it is convenient from the point of view of data processing ease. However, the pitch of the speed changing points may of course be set within the frame region independently of the cell region.

Even if the stage 13 moves as specified by the stage moving information, the information dependent on the electron beam exposure apparatus, that is, depending on the state of the electron beam exposure apparatus, there are cases where it is difficult to draw at the specified stage moving speed. For this reason, the drawability judging circuit 3 within the main deflector control circuit 2 always judges the drawable state, and notifies the judgement result to the stage control circuit 7. The stage control circuit 7 monitors the drawable state based on the judgement result obtained from the drawability judging circuit 3.

Figure 5:
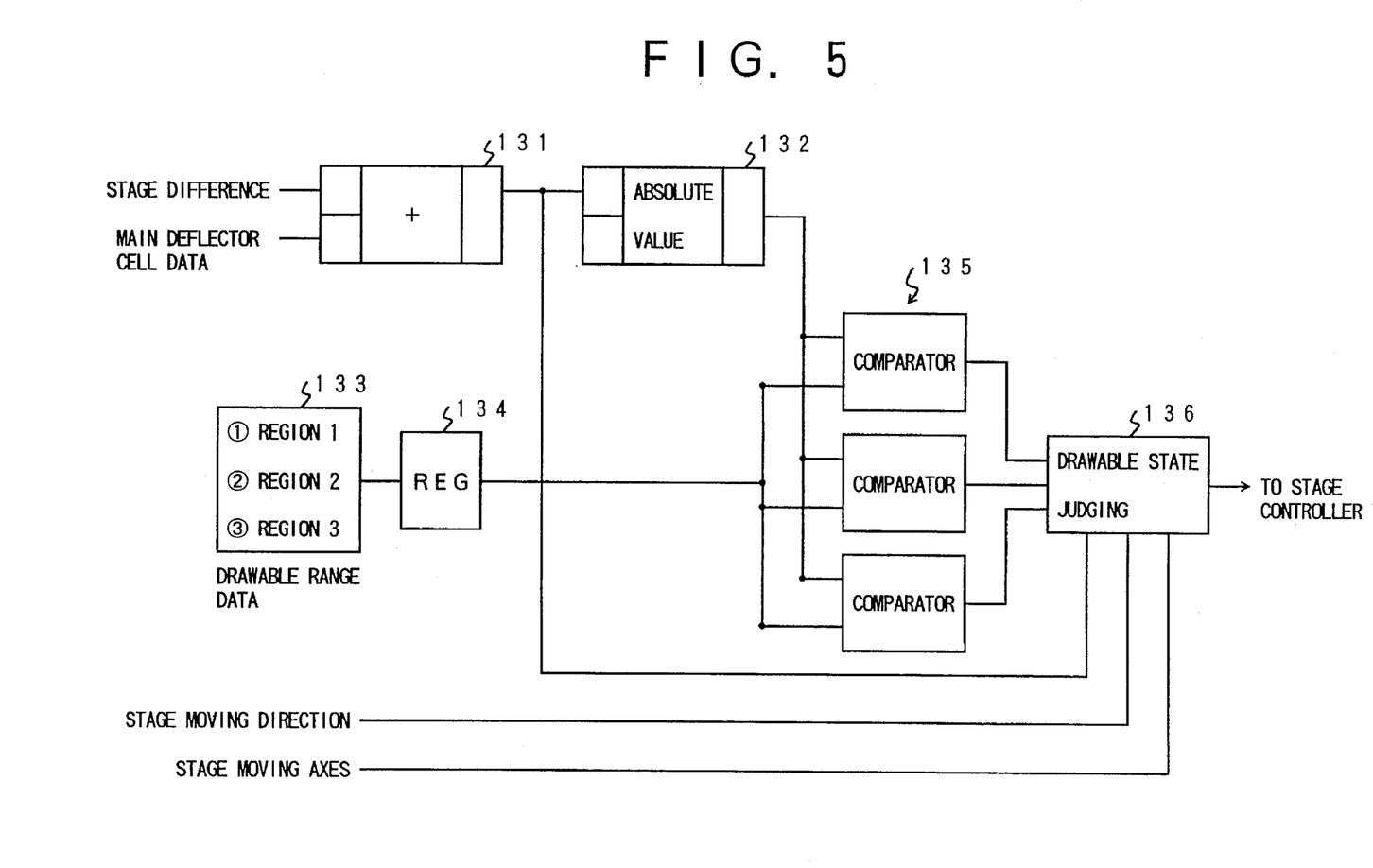
FIG. 5 is a system block diagram showing an embodiment of a drawability judging circuit.

FIG. 5 shows an embodiment of the drawability judging circuit 3 within the main deflector control circuit 2. The drawability judging circuit 3 includes an adder 131, an arithmetic circuit 132, a register 134 for storing drawable range data 133, a comparator circuit 135, and a drawable state judging circuit 136.

The adder 131 adds a stage difference before the correction and main deflection cell data before the correction obtained in the main deflector control circuit 2. The main deflection cell data before the correction refers to the deflection data with respect to the main deflector coils 15 for the cell region before the correction is made. In addition, the stage difference before the correction refers to a difference between the target position of the stage for drawing the cell region and the present position of the stage before the correction is made. The added result from the adder 131 is supplied to the arithmetic circuit 132 which obtains the absolute value corresponding to the large deflection quantity. The added result from the adder 131 is also supplied to the drawable state judging circuit 136.

The large deflection quantity from the arithmetic circuit 132 is supplied to the comparator circuit 135 which is made up of three comparators. The comparator circuit 135 also receives the drawable range data 133 from the register 134. A comparison result of the large deflection quantity and the drawable range data 133 is suppled from the comparator circuit 135 to the drawable state judging circuit 136. The drawable state judging circuit 136 judges the present drawing state based on the comparison result from the comparator circuit 135, the added result from the adder 131, the data related to the stage moving direction and the data related to the stage moving axes (X, Y). More particularly, the drawable state judging circuit 136 judges whether the drawing state is the drawable state, non-reached state or the passed state. In addition, when in the drawable state, the drawable state judging circuit 136 also judges whether the state of the stage moving speed is "extremely low", "low", "safe", "caution" or "dangerous".

When the state of the stage moving speed is "extremely low" in the drawable state, it is indicated that the stage 13 is moving at an extremely low speed, and the upper limit of the acceleration is limited to a relatively large value. When the state of the stage moving speed is "low" in the drawable state, it is indicated that the stage 13 is moving at a low speed, and the upper limit of the acceleration is limited to a relatively small value. When the state of the stage moving speed is "safe", the deflected position of the electron beam caused by the main deflector coils 15 is located in a safe region within the drawable range, and it is indicated that the stage 13 is moving at a constant speed. The safe range within the drawable range refers to the range in which the accurate and stable deflection of the electron beam by the main deflector coils 15 is guaranteed. When the state of the stage moving speed is "caution" in the drawable state, it is indicated that the stage 13 is moving at a high speed, and the lower limit of the deceleration is limited to a relatively small value. In addition, when the state of the stage moving speed is "dangerous", it is indicated that the stage 13 is moving at an extremely high speed, and the lower limit of the deceleration is limited to a relatively large value. Accordingly, even in the drawable state, the stage moving speed is limited and controlled depending on the deflected position of the electron beam caused by the main deflector coils 15 within the drawable range. As a result, it is possible to move the stage 13 so that the deflected position of the electron beam caused by the main deflector coils 15 always falls in the safe region within the drawable range.

Figure 6:
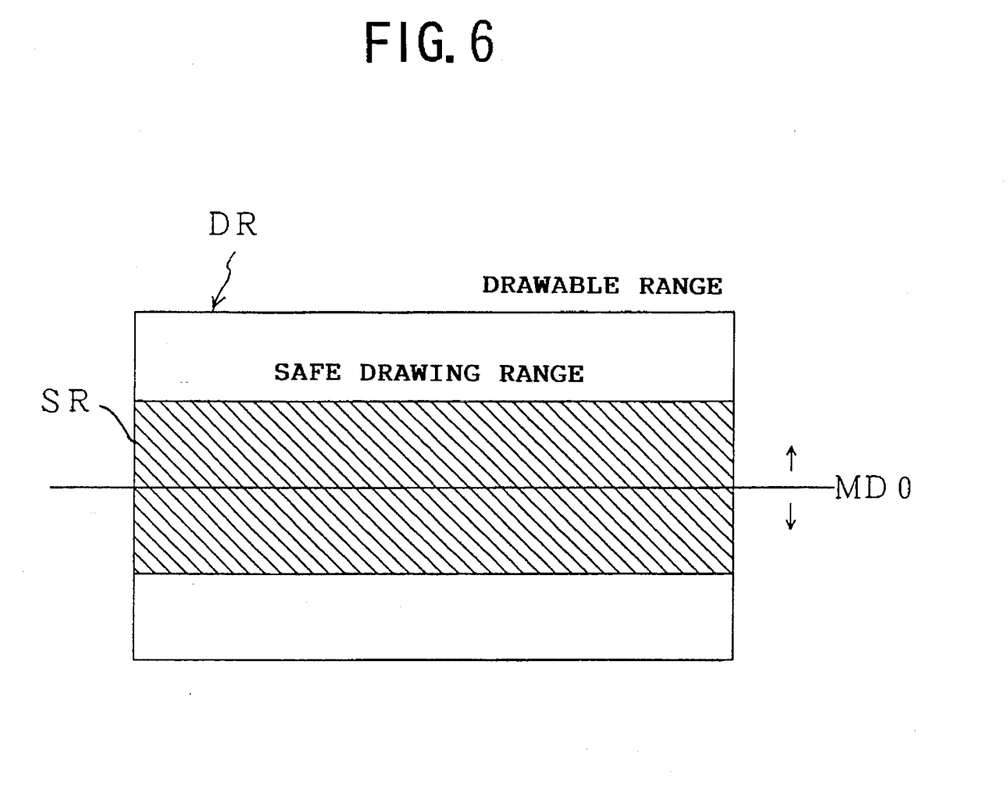
FIG. 6 is a diagram for explaining a safe range within the drawable range.

In this embodiment, the safe region within the drawable range is set as shown in FIG. 6. In FIG. 6, a safe region SR is set to have ½ the range of a drawable range DR as indicated by the hatching. A position MD0 in FIG. 6 indicates a position where the deflection quantity of the main deflector coils 15 is zero.

If the judgement result of the drawable state judging circuit 136 indicates the non-reached state, the stage 13 is moved at the constant speed. On the other hand, if the judgement result of the drawable state judging circuit 136 indicates the passed state, the stage moving speed is decelerated. Accordingly, the operation of this embodiment in the case where the judgement result of the drawable state judging circuit 136 indicates the non-reached state or the passed state is essentially the same as the exposure method previously proposed in the Japanese Laid-Open Patent Application No. 5-90142 referred above.

When the beam OFF state occurs during the drawing of the frame region after the stage 13 starts to move, the drawability judging circuit 3 forcibly sets the stage moving speed of the drawable state to the "safe" speed, and notifies this "safe" speed to the stage control circuit 7.

Figure 7:
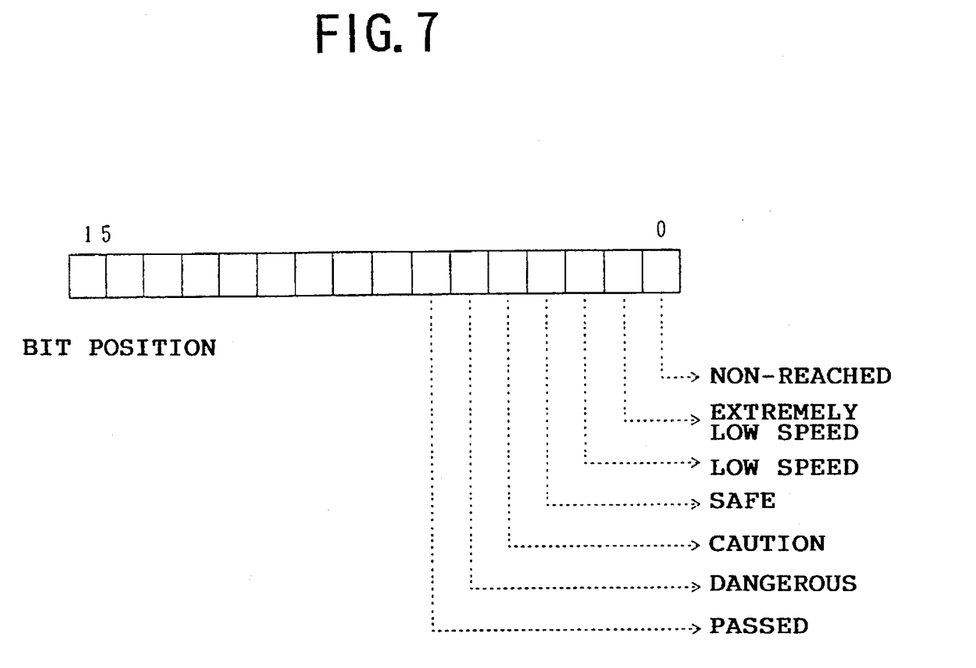
FIG. 7 is a diagram showing a judgement result of a drawable state judging circuit.

The judgement result of the drawable state judging circuit 136 is notified to the stage control circuit 7. In this embodiment, this judgement result is notified to in the form of a 16-bit data as shown in FIG. 7. When the judgement result of the drawable state judging circuit 136 is notified in the form of flags as shown in FIG. 7, the stage control circuit 7 can easily grasp the drawable state, and it is possible to reduce the processing time.

Of course, it is possible to notify the judgement result of the drawable state judging circuit 136 to the state control circuit 7 in the form of data related to real numbers.

Figure 8:
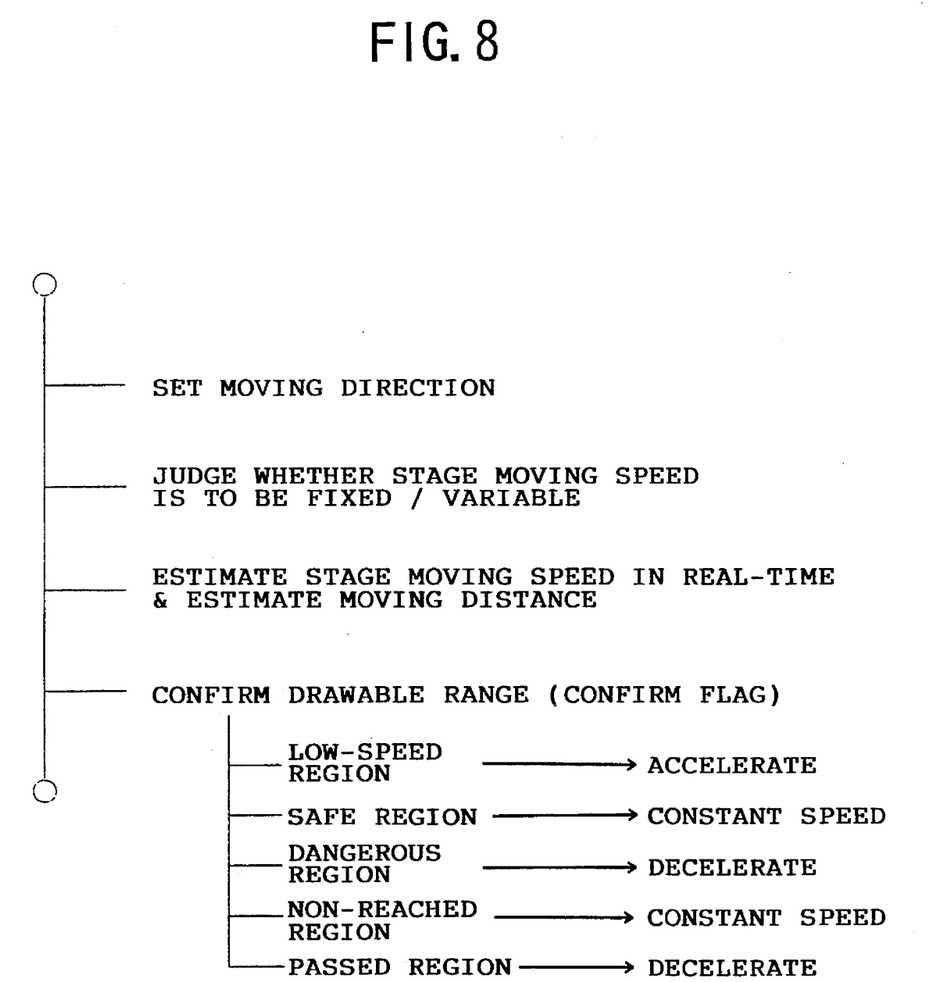
FIG. 8 is a diagram generally showing the entire operation of a main deflector control circuit.

FIG. 8 generally shows the entire operation of the main deflector control circuit 2 including the drawability judging circuit 3. As shown in FIG. 8, the moving direction of the stage 13 is set. In addition, a judgement is made to determine whether the stage moving speed is to be fixed or to be made variable. Moreover, the stage moving speed is estimated, and the distance to the target position (value) of the stage 13 is estimated. Furthermore, the drawable range is confirmed based on the flags show in FIG. 7, for example. The confirmation of the drawable range corresponds to the process of the drawability judging circuit 3.

Therefore, according to this embodiment, the deflected position of the electron beam caused by the main deflector coils 15 is detected while the stage 13 moves at the specified stage moving speed. When the deflected position of the electron beam that is detected leans towards the rear with respect to the stage moving direction, the stage moving speed is decelerated with respect to the specified stage moving speed. ON the other hand, when the deflected position of the electron beam that is detected leans towards the front with respect to the stage moving direction, the stage moving speed is accelerated with respect to the specified stage moving speed. The following formula stands, where T0 denotes the final time when the actual deflected position of the electron beam caused by the main deflector coils 15 is positioned in the safe range within the drawable range, t1 denotes the first time when the deflected position of the electron beam caused by the main deflector coils 15 passes the position MD0 (deflection quantity=0), e denotes the correction quantity of the stage moving speed, V denotes the specified stage moving speed, and DR denotes the drawable range.

$$\sigma V = (DR/2)/(t1-t0)$$

Accordingly, it is necessary in this case to decelerate the specified stage moving speed V to a speed V' described by V'=V−σV.

Further, the present invention is not limited to these embodiments, but various variations and modifications may be made without departing from the scope of the present invention.

What is claimed is:

1. A charged particle beam exposure method which carries out an exposure by irradiating a charged particle beam on a substrate placed on a stage while continuously moving the stage and deflecting the charged particle beam by main deflector means and sub deflector means, said charged particle beam exposure method comprising the steps of:

(a) calculating stage moving information which describes an optimum expected locus of a stage moving speed with respect to a frame region based on a stage moving speed that enables exposure within each cell region within the frame region, by defining the frame region as being made up of a plurality of cell regions arranged in a moving direction of the stage within a drawable range in which the charged particle beam can be deflected by the main deflector means, the optimum expected locus of the stage moving speed including expected changes in the stage moving speed and the times at which the expected speed changes are expected to occur; and (b) controlling a deflected position of the charged particle beam caused by the main deflector means by variably controlling the stage moving speed based on said stage moving information.

2. The charged particle beam exposure method as claimed in claim 1, wherein said stage moving information includes, in addition to information related to the stage moving speed in each cell region, at least one item of information selected from a group of items of information consisting of information related to a starting coordinate, an end coordinate, an initial speed, a number of chips, a chip arranging pitch, a chip start position, number of speed changes, and a speed changing pitch.

3. The charged particle beam exposure method as claimed in claim 1, which further comprises the steps of:

(c) storing in advance said stage moving information in storage means, said step (b) variably controlling the stage moving speed based on the stage moving information stored in said storage means.

4. The charged particle beam exposure method as claimed in claim 1, which further comprises the steps of:

(d) detecting the deflected position of the charged particle beam caused by said main deflector means while the stage moves at a specified stage moving speed and decelerating the stage moving speed with respect to the specified stage moving speed if the deflected position of the charged particle beam that is detected leans towards a front with respect to the stage moving direction and accelerating the stage moving speed with respect to the specified stage moving speed if the deflected position of the charged particle beam leans towards a rear with respect to the stage moving direction.

5. The charged particle beam exposure method as claimed in claim 4, wherein:

said step (d) decelerates the specified stage moving speed to a speed V' described by V'=V−σV according to a formula $$\sigma V = (DR/2)/(t1-t0)$$

where T0 denotes a final time when an actual deflected position of the charged particle beam caused by the main deflector means is positioned in a safe range within the drawable range, t1 denotes a first time when the deflected position of the charged particle beam caused by the main deflector means passes a position MD0 where a deflection quantity is zero, σ denotes a correction quantity of the stage moving speed, V denotes the specified stage moving speed, and DR denotes the drawable range, said safe range being a range within the drawable range in which accurate and stable deflection of the charged particle beam by the main deflector means is guaranteed.

6. The charged particle beam exposure method as claimed in claim 1, which further comprises the steps of:

(e) moving the stage as it is at a constant speed without acceleration if the speed is to be changed before the stage reaches the specified stage moving speed in a state where the deflected position of the charged particle beam caused by the main deflector means is located other than at a boundary part of a speed changing pitch of the stage moving speed when decelerating or accelerating the stage to a next speed within a time when the deflected position of the charged particle beam caused by the main deflector means moves within the speed changing pitch.

7. The charged particle beam exposure method as claimed in claim 6, wherein said step (e) carries out a control to start the deceleration at a point that is L before a next speed changing point so that an actual stage moving speed will always not exceed the speed at the speed changing point, where the speed at the point that is L before the next speed changing point is obtained by $L=(V_n-V_{n+1})/\alpha$, $V_n$ denotes the present speed, $V_{n+1}$ denotes the next speed and $\alpha$ denotes the acceleration.

8. The charged particle beam exposure method as claimed in claim 6, wherein the speed changing pitch is set equal to a pitch of the cell regions.

9. A charged particle beam exposure apparatus which carries out an exposure by irradiating a charged particle beam on a substrate placed on a stage while continuously moving the stage and deflecting the charged particle beam by main deflector means and sub deflector means, said charged particle beam exposure apparatus comprising:

first means for calculating stage moving information which describes an optimum expected locus of a stage moving speed with respect to a frame region based on a stage moving speed that enables exposure within each cell region within the frame region, by defining the frame region as being made up of a plurality of cell regions arranged in a moving direction of the stage within a drawable range in which the charged particle beam can be deflected by the main deflector means, the optimum expected locus of the stage moving speed including expected changes in the stage moving speed and the times at which the expected speed changes are expected to occur; and second means for controlling a deflected position of the charged particle beam caused by the main deflector means by variably controlling the stage moving speed based on said stage moving information.

10. The charged particle beam exposure apparatus as claimed in claim 9, wherein said stage moving information includes in addition to information related to the stage moving speed in each cell region at least one information selected from a group of information consisting of information related to a starting coordinate, an end coordinate, an initial speed, a number of chips, a chip arranging pitch, a chip start position, number of speed changes, and a speed changing pitch.

11. The charged particle beam exposure apparatus as claimed in claim 9, which further comprises:

storage means for storing in advance said stage moving information in storage means, said second means variably controlling the stage moving speed based on the stage moving information stored in said storage means.

12. The charged particle beam exposure apparatus as claimed in claim 9, which further comprises:

third means for detecting the deflected position of the charged particle beam caused by said main deflector means while the stage moves at a specified stage moving speed and decelerating the stage moving speed with respect to the specified stage moving speed if the deflected position of the charged particle beam that is detected leans towards a front with respect to the stage moving direction and accelerating the stage moving speed with respect to the specified stage moving speed if the deflected position of the charged particle beam leans towards a rear with respect to the stage moving direction.

13. The charged particle beam exposure apparatus as claimed in claim 12, wherein:

said third means decelerates the specified stage moving speed to a speed V' described by $V'=V-\sigma V$ according to a formula $$\sigma V = (DR/2)/(t1-t0)$$

where T0 denotes a final time when an actual deflected position of the charged particle beam caused by the main deflector means is positioned in a safe range within the drawable range, t1 denotes a first time when the deflected position of the charged particle beam caused by the main deflector means passes a position MD0 where a deflection quantity is zero, σ denotes a correction quantity of the stage moving speed, V denotes the specified stage moving speed, and DR denotes the drawable range, said safe range being a range within the drawable range in which accurate and stable deflection of the charged particle beam by the main deflector means is guaranteed.

14. The charged particle beam exposure apparatus as claimed in claim 9, which further comprises:

fourth means for moving the stage as it is at a constant speed without acceleration if the speed is to be changed before the stage reaches the specified stage moving speed in a state where the deflected position of the charged particle beam caused by the main deflector means is located other than at a boundary part of a speed changing pitch of the stage moving speed when decelerating or accelerating the stage to a next speed within a time when the deflected position of the charged particle beam caused by the main deflector means moves within the speed changing pitch.

15. The charged particle beam exposure apparatus as claimed in claim 14, wherein said fourth means carries out a control to start the deceleration at a point that is L before a next speed changing point so that an actual stage moving speed will always not exceed the speed at the speed changing point, where the speed at the point that is L before the next speed changing point is obtained by $L=(V_n-V_{n+1})/\alpha$, $V_n$ denotes the present speed, $V_{n+1}$ denotes the next speed and α denotes the acceleration.

16. The charged particle beam exposure apparatus as claimed in claim 14, wherein the speed changing pitch is set equal to a pitch of the cell regions.

* * * * *